United States Patent
Xue et al.

(10) Patent No.: US 10,204,536 B2
(45) Date of Patent: Feb. 12, 2019

(54) ARRAY SUBSTRATE, DISPLAY PANEL, DISPLAY DEVICE AND DRIVING METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yanna Xue, Beijing (CN); Xiaochuan Chen, Beijing (CN); Hailin Xue, Beijing (CN); Yue Li, Beijing (CN); Yong Zhang, Beijing (CN); Wenjun Xiao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 210 days.

(21) Appl. No.: 15/022,537

(22) PCT Filed: Oct. 22, 2015

(86) PCT No.: PCT/CN2015/092496
§ 371 (c)(1),
(2) Date: Mar. 16, 2016

(87) PCT Pub. No.: WO2016/188024
PCT Pub. Date: Dec. 1, 2016

(65) Prior Publication Data
US 2017/0162096 A1 Jun. 8, 2017

(30) Foreign Application Priority Data
May 28, 2015 (CN) .......................... 2015 1 0284861

(51) Int. Cl.
*G09G 3/20* (2006.01)
*G02F 1/1362* (2006.01)
*G09G 3/3225* (2016.01)
*G09G 3/3275* (2016.01)
*G09G 3/36* (2006.01)
*H01L 27/32* (2006.01)

(52) U.S. Cl.
CPC ......... *G09G 3/2003* (2013.01); *G02F 1/1362* (2013.01); *G09G 3/3225* (2013.01);
(Continued)

(58) Field of Classification Search
CPC .. G09G 3/2003; G09G 3/3688; G09G 3/3225; G09G 3/3275; G09G 3/3607;
(Continued)

(56) References Cited

U.S. PATENT DOCUMENTS

2014/0118657 A1 5/2014 Duan
2015/0002553 A1 1/2015 Chang et al.
(Continued)

FOREIGN PATENT DOCUMENTS

CN 102707525 A 10/2012
CN 103488016 A 1/2014
(Continued)

OTHER PUBLICATIONS

First Office Action regarding Chinese Application No. 201510284861.1, dated Apr. 28, 2017. Translation provided by Dragon Intellectual Property Law Firm.
(Continued)

*Primary Examiner* — Rodney Amadiz
(74) *Attorney, Agent, or Firm* — Harness, Dickey & Pierce, P.L.C.

(57) ABSTRACT

The present disclosure relates to an array substrate, a display panel, a display device and a driving method. The array substrate includes a plurality of sub-pixel dot matrix units. In each of the plurality of sub-pixel dot matrix units, the sub-pixels in a same row are connected to data lines
(Continued)

arranged on a same side of the sub-pixels respectively, the sub-pixels in the rows where the sub-pixels are arranged in a same sequence are connected to the data lines in a same direction, and two first base color sub-pixels in at least two adjacent rows are connected to a same data line.

20 Claims, 5 Drawing Sheets

(52) U.S. Cl.
CPC ......... *G09G 3/3275* (2013.01); *G09G 3/3607* (2013.01); *G09G 3/3688* (2013.01); *H01L 27/3218* (2013.01); *H01L 27/3276* (2013.01); *G02F 2201/52* (2013.01); *G09G 2300/0426* (2013.01); *G09G 2300/0452* (2013.01); *G09G 2310/0213* (2013.01); *G09G 2310/0235* (2013.01); *G09G 2330/023* (2013.01)

(58) Field of Classification Search
CPC ... G09G 2310/0235; G09G 2310/0213; G09G 2300/0452; G09G 2330/023
See application file for complete search history.

(56) References Cited

U.S. PATENT DOCUMENTS

| | | |
|---|---|---|
| 2016/0233234 A1 | 8/2016 | Yang et al. |
| 2017/0053608 A1 | 2/2017 | Li et al. |
| 2017/0146839 A1 | 5/2017 | Li et al. |
| 2017/0162096 A1 | 6/2017 | Xue et al. |

FOREIGN PATENT DOCUMENTS

| | | |
|---|---|---|
| CN | 104483794 A | 4/2015 |
| CN | 104503180 A | 4/2015 |
| CN | 104570531 A | 4/2015 |
| CN | 104678670 A | 6/2015 |
| CN | 104751821 A | 7/2015 |
| CN | 104820326 A | 8/2015 |
| CN | 104992957 A | 10/2015 |
| EP | 0637009 A2 | 2/1995 |

OTHER PUBLICATIONS

International Search Report and Written Opinion of the International Searching Authority for International Application No. PCT/CN2015/092496, dated Jan. 26, 2016. Translation provided by Dragon Intellectual Property Law Firm.

ARRAY SUBSTRATE, DISPLAY PANEL, DISPLAY DEVICE AND DRIVING METHOD

CROSS REFERENCE OF RELATED APPLICATIONS

This application is the U.S. national phase of PCT Application No. PCT/CN2015/092496 filed on Oct. 22, 2015, which claims a priority of the Chinese Patent Application No. 201510284861.1 filed on May 28, 2015, the disclosures of which are incorporated in their entirety by reference herein.

TECHNICAL FIELD

The present disclosure relates to a technical field of displaying, and in particular to an array substrate, a display panel, a display device and a driving method.

BACKGROUND

Virtual display may be implemented by a simple process while still achieving high resolution and high display quality, and thus the development thereof grows rapidly in the displaying field.

As illustrated in FIG. 1, in a conventional virtual display, each display unit (B1, B2, . . . , Bk, B(k+1), . . . ) is formed by four rows of sub-pixels in a pixel array, and the four rows of sub-pixels include a row arranged in a sequence of a red sub-pixel, a green sub-pixel and a blue sub-pixel (RGB), a row arranged in a sequence of a blue sub-pixel, a red sub-pixel and a green sub-pixel (BRG), a row arranged in a sequence of a green sub-pixel, a blue sub-pixel and a red sub-pixel (GBR), and a row arranged in a sequence of a blue sub-pixel, a red sub-pixel and a green sub-pixel (BRG). When an image of solid color is to be displayed, for example when an image of red (R) is to be displayed, all of data lines S1, S2 and S3 should be turned on upon progressively scanning gate lines G1-G4 due to signal pulses as illustrated in FIG. 1. As a result, the virtual display has a disadvantage of high power consumption.

SUMMARY

An object of the present disclosure is to provide an array substrate, a display panel, a display device and a driving method, so as to reduce the high power consumption of the conventional virtual display, which is caused by turning on all of the data lines when the image of solid color is to be displayed.

For achieving the above object, the embodiments of present disclosure provides the following technical solutions.

In a first aspect, the present disclosure provides an array substrate including a plurality of sub-pixel dot matrix units, wherein each of the plurality of sub-pixel dot matrix units includes 2n rows of sub-pixels, and each row of the sub-pixels includes a first base color sub-pixel, a second base color sub-pixel and a third base color sub-pixel, where $n \geq 2$ and n is a positive integer. In a first row, the first base color sub-pixel, the second base color sub-pixel and the third base color sub-pixel are arranged sequentially. the sub-pixels in an i-th row are arranged in a sequence obtained by moving the sub-pixels in an (i−1)-th row by one position along a first direction or a second direction opposite to the first direction, and the sub-pixels in an (n+1+j)-th row are arranged in a same sequence as the sub-pixels in an (n+1−j)-th row, where $2 \leq i \leq n+1 \leq j \leq n-1$, and both i and j are positive integers. in each of the plurality of sub-pixel dot matrix units, the sub-pixels in a same row are connected to data lines arranged on a same side of the sub-pixels respectively, the sub-pixels in the rows where the sub-pixels are arranged in a same sequence are connected to the data lines in a same direction, and two first base color sub-pixels in at least two adjacent rows are connected to a same data line.

In a first implementation of the first aspect, in each of the plurality of sub-pixel dot matrix units, two first base color sub-pixels in the first row and a second row are connected to a same data line.

In a second implementation of the first aspect associated with the first implementation, when n=2, in each of the plurality of sub-pixel dot matrix units, the first base color sub-pixel, the second base color sub-pixel and the third base color sub-pixel in the first row are connected to a first data line, a second data line and a third data line respectively; the third base color sub-pixel, the first base color sub-pixel and the second base color sub-pixel in the second row are connected to a fourth data line, the first data line and the second data line respectively, wherein the fourth data line is neighboring with the first data line in the second direction; the second base color sub-pixel, the third base color sub-pixel and the first base color sub-pixel in a third row are connected to the first data line, the second data line and the third data line respectively; and the third base color sub-pixel, the first base color sub-pixel and the second base color sub-pixel in a fourth row are connected to the fourth data line, the first data line and the second data line respectively.

In a third implementation of the first aspect associated with the first implementation, when n=3, in each of the plurality of sub-pixel dot matrix units, the first base color sub-pixel, the second base color sub-pixel and the third base color sub-pixel in the first row are connected to a first data line, a second data line and a third data line respectively; the third base color sub-pixel, the first base color sub-pixel and the second base color sub-pixel in the second row are connected to a fourth data line, the first data line and the second data line respectively, wherein the fourth data line is neighboring with the first data line in the second direction; the second base color sub-pixel, the third base color sub-pixel and the first base color sub-pixel in a third row are connected to the first data line, the second data line and the third data line respectively; the first base color sub-pixel, the second base color sub-pixel and the third base color sub-pixel in a fourth row are connected to the fourth data line, the first data line and the second data line respectively; the second base color sub-pixel, the third base color sub-pixel and the first base color sub-pixel in a fifth row are connected to the first data line, the second data line and the third data line respectively; and the third base color sub-pixel, the first base color sub-pixel and the second base color sub-pixel in a sixth row are connected to the fourth data line, the first data line and the second data line respectively.

In a fourth implementation of the first aspect associated with the first aspect, the first base color sub-pixel, the second base color sub-pixel and the third base color sub-pixel in the first implementation, the second implementation, or the third implementation, are a red sub-pixel, a green sub-pixel and a blue sub-pixel respectively.

In a second aspect, the present disclosure provides a display panel including the array substrate according to any one of the above aspect and implementations.

In a third aspect, the present disclosure provides a display device including the display panel according to the second aspect.

In a fourth aspect, the present disclosure provides a method for driving the display device according to the third aspect, including a step of:

when an image to be displayed by the display device is of a first base color, inputting a data signal into a data line connected to a first base color sub-pixel in one scanning period; or when the image to be displayed by the display device is of a second base color, inputting the data signal into a data line connected to a second base color sub-pixel in the one scanning period; or when the image to be displayed by the display device is of a third base color, inputting the data signal into a data line connected to a third base color sub-pixel in the one scanning period.

In a first implementation of the fourth aspect, n=2, and for each of the plurality of sub-pixel dot matrix units, the method includes:

when the image to be displayed by the display device is of the first base color, inputting the data signal into a first data line during a period of scanning a first row and a second row of sub-pixels, inputting the data signal into a third data line during a period of scanning a third row of sub-pixels, and inputting the data signal into the first data line during a period of scanning a fourth row of sub-pixels;

when the image to be displayed by the display device is of the second base color, inputting the data signal into the second data line during the period of scanning the first row and the second row of sub-pixels, inputting the data signal into the first data line during the period of scanning the third row of sub-pixels, and inputting the data signal into the second data line during the period of scanning the fourth row of sub-pixels; and when the image to be displayed by the display device is of the third base color, inputting the data signal into the third data line during a period of scanning the first row of sub-pixels, inputting the data signal into the fourth data line during a period of scanning the second row of sub-pixels, inputting the data signal into the second data line during the period of scanning the third row of sub-pixels, and inputting the data signal into the fourth data line during the period of scanning the fourth row of sub-pixels, wherein, in each of the plurality of sub-pixel dot matrix units, the first data line, the second data line and the third data line are arranged sequentially in a first direction, and the fourth data line is neighboring with the first data line in a second direction opposite to the first direction.

In a second implementation of the fourth aspect, n=3, and for each of the plurality of sub-pixel dot matrix units, the method includes:

when the image to be displayed by the display device is of the first base color, inputting the data signal into a first data line during a period of scanning a first row and a second row of sub-pixels, inputting the data signal into a third data line during a period of scanning a third row of sub-pixels, inputting the data signal into a fourth data line during a period of scanning a fourth row of sub-pixels, inputting the data signal into the third data line during a period of scanning a fifth row of sub-pixels, and inputting the data signal into the first data line during a period of scanning a sixth row of sub-pixels;

when the image to be displayed by the display device is of the second base color, inputting the data signal into the second data line during the period of scanning the first and second rows of sub-pixels, inputting the data signal into the first data line during a period of scanning the third, fourth and fifth rows of sub-pixels, and inputting the data signal into the second data line during the period of scanning the sixth row of sub-pixels; and when the image to be displayed by the display device is of the third base color, inputting the data signal into the third data line during a period of scanning the first row of sub-pixels, inputting the data signal into the fourth data line during a period of scanning the second row of sub-pixels, inputting the data signal into the second data line during the period of scanning the third, fourth and fifth rows of sub-pixels, and inputting the data signal into the fourth data line during the period of scanning the sixth row of sub-pixels, wherein, in each of the plurality of sub-pixel dot matrix units, the first data line, the second data line and the third data line are arranged sequentially in a first direction, and the fourth data line is neighboring with the first data line in a second direction opposite to the first direction.

In a third implementation of the fourth aspect, the first base color sub-pixel, the second base color sub-pixel and the third base color sub-pixel are a red sub-pixel, a green sub-pixel and a blue sub-pixel respectively.

According to the array substrate, the display pane, the display device and the driving method of the present disclosure, the sub-pixels in the i-th row in the array substrate are arranged in a sequence obtained by moving the sub-pixels in an (i−1)-th row by one position along a first direction or a second direction opposite to the first direction in rotation, and the sub-pixels in an (n+1+j)-th row are arranged in a same sequence as the sub-pixels in an (n+1−j)-th row. In each of the plurality of sub-pixel dot matrix units, the sub-pixels in a same row are connected to data lines arranged on a same side of the sub-pixels respectively. The sub-pixels in the rows where the sub-pixels are arranged in a same sequence are connected to the data lines in a same direction. Two first base color sub-pixels in at least two adjacent rows are connected to a same data line. In other words, the first base color sub-pixels/the second base color sub-pixels/the third base color sub-pixels in at least two columns are connected to the same data line. As a result, it is not necessary for at least one of the data lines to be turned on when the image of solid color is to be displayed, and thereby the power consumption is reduced.

BRIEF DESCRIPTION OF THE DRAWINGS

In order to illustrate the technical solutions of the present disclosure or the related art in a clearer manner, the drawings desired for the embodiments will be described briefly hereinafter. Obviously, the following drawings merely relate to some embodiments of the present disclosure, and based on these drawings, a person skilled in the art may obtain the other drawings without any creative effort.

DETAILED DESCRIPTION

In the following, it is clearly and completely described the technical solutions according to the embodiments of the present disclosure. It is obvious that the described embodiments are merely some of all the embodiment of the present disclosure instead of all the embodiment. All of other embodiment that those skilled in the art may be implemented based on the embodiments in the present disclosure without creative work should also fall within the scope of the present disclosure.

In the present disclosure, in order to explain the technical solutions of the present disclosure in a clearer manner, such words as "first" and "second" are used in the specification and claims are merely used to differentiate different components with similar or same functions and applications rather than to represent any order, number or importance. Unless otherwise defined, any technical or scientific term used herein shall have the common meaning understood by a person of ordinary skills. Such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Embodiment 1

Figure 1:
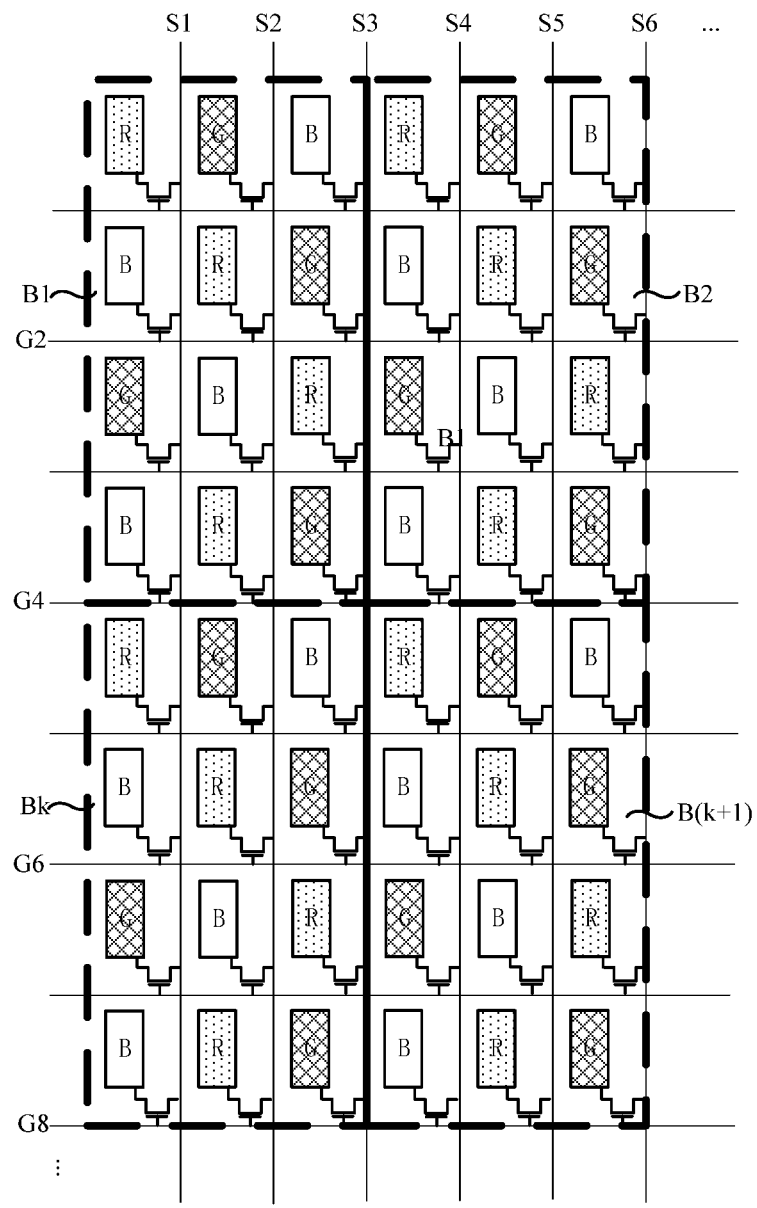
FIG. 1 is a schematic view showing an array substrate in prior art.
Figure 2:
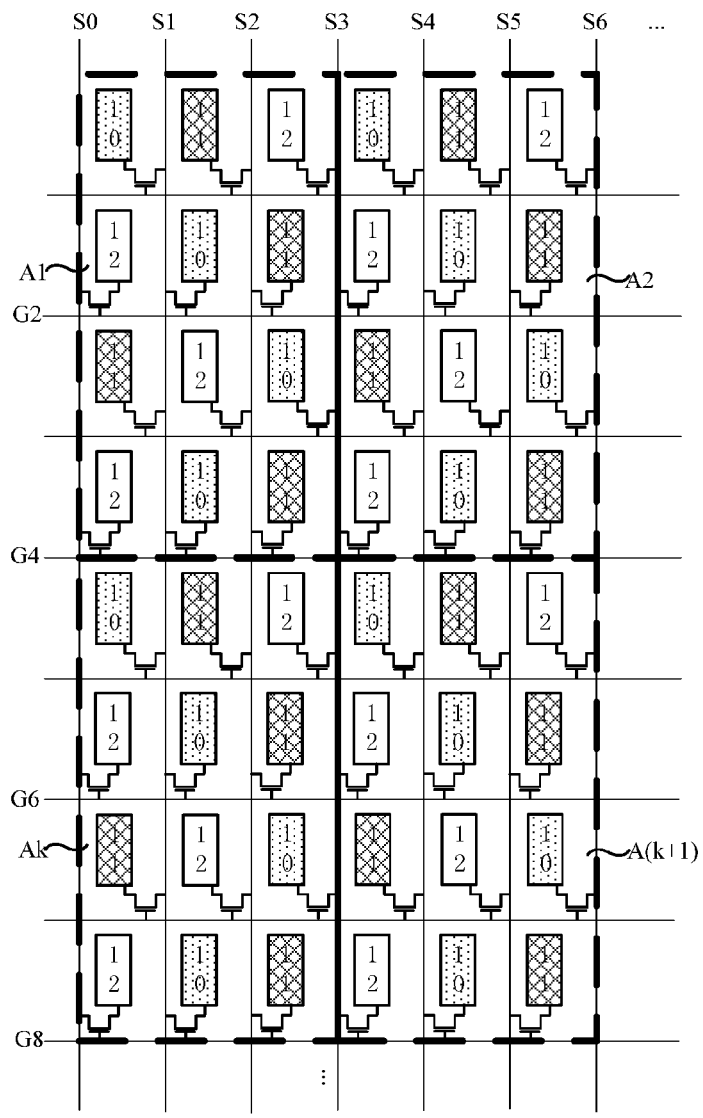
FIG. 2 is a schematic view showing an array substrate according to an embodiment of the present disclosure.

As illustrated in FIG. 2, the present disclosure provides in an embodiment an array substrate which may include a plurality of sub-pixel dot matrix units (A1, A2 . . . Ak, A(k+1) . . . ). Each of the plurality of sub-pixel dot matrix units includes 2n rows of sub-pixels, and each row of the sub-pixels includes a first base color sub-pixel 10, a second base color sub-pixel 11 and a third base color sub-pixel 12. In a first row, the first base color sub-pixel 10, the second base color sub-pixel 11 and the third base color sub-pixel 12 are arranged sequentially. The sub-pixels in an i-th row are arranged in a sequence obtained by moving the sub-pixels in an (i−1)-th row by one position along a first direction or a second direction opposite to the first direction. The sub-pixels in an (n+1+j)-th row are arranged in a same sequence as the sub-pixels in an (n+1−j)-th row, where $2 \leq i \leq n+1$, $1 \leq j \leq n-1$, and both i and j are positive integers. Here, the plurality may be at least one.

Furthermore, in each of the plurality of sub-pixel dot matrix units, the sub-pixels in a same row are connected to data lines arranged on a same side of the sub-pixels respectively, the sub-pixels in the rows where the sub-pixels are arranged in a same sequence are connected to the data lines in a same direction, and two first base color sub-pixels in at least two adjacent rows are connected to a same data line.

It is appreciated that the following points should be noted.

Firstly, it is known that the display panel mainly encompasses pixels, and each of the pixels generally includes a plurality of display units (i.e. "sub-pixels"), such as a red display unit, a green display unit and a blue display unit. In the present disclosure, for a convenience of explanation, a portion of a display unit on the array substrate is also called a sub-pixel. Furthermore, a portion of the red display unit on the array substrate is called a red (R) sub-pixel; a portion of the green display unit on the array substrate is called a green (G) sub-pixel; and a portion of the blue display unit on the array substrate is called a blue (B) sub-pixel.

Figure 3:
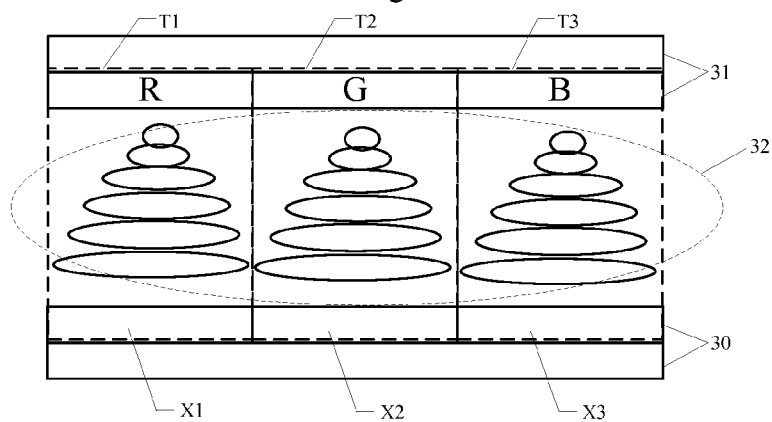
FIG. 3 is a schematic view showing a display panel according to an embodiment of the present disclosure.

As illustrated in FIG. 3, for example, a liquid crystal display (LCD) panel generally includes an array substrate 30 and a color filter substrate 31 arranged oppositely, and liquid crystals 32 which is filled in a gap between these two substrates. In FIG. 3, the display unit is indicated by a reference sign "T". In particular, the red display unit is indicated by "T1", the green display unit is indicated by "T2", and the blue display unit is indicated by "T3".

In FIG. 3, a portion of the display unit T on the array substrate is indicated by a reference sign "X" and called a sub-pixel. In particular, a portion of the red display unit T1 on the array substrate is a red sub-pixel and indicated by "X1"; a portion of the green display unit T2 on the array substrate is a blue sub-pixel and indicated by "X2"; and a portion of the blue display unit T3 on the array substrate is a blue sub-pixel and indicated by "X3".

The configuration of the sub-pixel on the array substrate is known for a person skilled in the art, and thus a description thereof is omitted herein. However, it should be noted that, when a layer for determining a color of emitted light (for example, a color filter layer, a color light-emitting layer) is not arranged on the array substrate, the configurations of the sub-pixels of different colors on the array substrate are same; and when the layer for determining the color of the emitted light is arranged on the array substrate, it is possible that the configurations of the sub-pixels of different colors on the array substrate might be slightly different due to the difference of the configuration of the layer for determining the color of the emitted light.

Furthermore, in the present disclosure, the array substrate may include the red sub-pixel, the green sub-pixel and the blue sub-pixel, which may correspond to a first base color sub-pixel 10, a second base color sub-pixel 11 and a third base color sub-pixel 12. For example, the first base color sub-pixel 10 may be the red sub-pixel, the second base color sub-pixel 11 may be the green sub-pixel, and the third base color sub-pixel 12 may be the blue sub-pixel; or the first base color sub-pixel 10 may be the green sub-pixel, the second base color sub-pixel 11 may be the red sub-pixel, and the third base color sub-pixel 12 may be the blue sub-pixel; or etc. The present disclosure is not limited to these examples.

As a matter of fact, in the embodiments of the present disclosure, in addition to the first base color sub-pixel 10, the second base color sub-pixel 11 and the third base color sub-pixel 12, each row of the sub-pixels in each sub-pixel dot matrix unit may further includes a fourth base color sub-pixel, a fifth base color sub-pixel, and etc., wherein the fourth base color sub-pixel and the fifth base color sub-pixel may be, for example a white (W) sub-pixel and a yellow (Y) sub-pixel respectively. The present disclosure is not limited to these examples.

Secondly, an intensity of light emitted by a display unit in the display panel may be determined based on an electrical field generated in the display unit, while the electrical field is generated typically based on voltages of two sorts of electrodes. For example, in the LCD panel, one sort of electrodes are pixel electrodes connected to data lines, and the other sort of electrodes are common electrodes, wherein the common electrodes of different display units are typically connected. For another example, in an organic light-emitting diode (OLED) display panel, one sort of electrodes are anodes connected to data lines, and the other sort of electrodes are cathodes, wherein the cathodes of different display units are typically connected, which may be called a common cathode.

In the embodiments of the present disclosure, a recitation that the sub-pixel is connected to the data line indicates that the data line is connected to an electrode of the sub-pixel, so as to input a data signal to the electrode of the sub-pixel. For example, for the LCD panel, a recitation that the sub-pixel is connected to the data line indicates that the date line is connected to an pixel electrode of the sub-pixel, so as to input a data signal to the pixel electrode of the sub-pixel; and for the OLED display panel, a recitation that the sub-pixel is connected to the data line indicates that the date line is connected to a cathode of the sub-pixel, so as to input a data signal to the cathode of the sub-pixel.

Furthermore, the data line is typically connected to the electrode of the sub-pixel by a thin film transistor (TFT), and the present disclosure is not limited thereto.

Thirdly, in the embodiments of the present disclosure, a "first direction" may indicate a direction in which the sub-pixels are arranged sequentially from left to right or an opposite direction. For example, in the embodiment as illustrated in FIG. 2, the "first direction" indicates a direction in which the sub-pixels are arranged sequentially from left to right, i.e. the "first direction" is of being towards right, and a "second direction" is of being towards left.

Fourthly, as illustrated in FIG. 2, the array substrate includes a plurality of columns of sub-pixels, and a data line is arranged between each two neighboring columns of sub-pixels. In the embodiments of the present disclosure, the recitation that "the sub-pixels in a same row are connected to data lines arranged on a same side of the sub-pixels respectively" indicates that all of the sub-pixels in the row are connected to the data lines arranged on right side of the sub-pixels respectively, or all of the sub-pixels in the row are connected to the data lines arranged on left side of the sub-pixels respectively. For example, in the embodiment as illustrated in FIG. 2, all of the sub-pixels in the first row are connected to the data lines arranged on right side of the sub-pixels respectively.

Fifthly, in the embodiments of the present disclosure, the recitation that "the sub-pixels in the rows where the sub-pixels are arranged in a same sequence are connected to the data lines in a same direction" indicates that all of the sub-pixels in the rows where the sub-pixels are arranged in a same sequence are connected to the data lines arranged on right side of the sub-pixels respectively, or all of the sub-pixels in the rows where the sub-pixels are arranged in a same sequence are connected to the data lines arranged on left side of the sub-pixels respectively. For example, as illustrated in FIG. 2, the sub-pixels in the second row and the sub-pixels in the fourth row are arranged in a same sequence, and both the sub-pixels in the second row and the sub-pixels in the fourth row are connected to the data lines arranged on left side of the sub-pixels respectively.

Sixthly, in the embodiments of the present disclosure, for each sub-pixel dot matrix unit in the array substrate as illustrated in FIG. 2, it is described with an example where n=2, and the first base color sub-pixel in the first row and the first base color sub-pixel in the second row are connected to a same data line, wherein in the sub-pixel dot matrix unit A1:

the first base color sub-pixel 10, the second base color sub-pixel 11 and the third base color sub-pixel 12 sequentially arranged in the first row are connected to the first data line S1, the second data line S2 and the third data line S3 respectively;

the third base color sub-pixel 12, the first base color sub-pixel 10 and the second base color sub-pixel 12 sequentially arranged in the second row are connected to the fourth data line S0, the first data line S1 and the second data line S2 respectively, wherein the fourth data line S0 is neighboring with the first data line S1 in a direction opposite to the first direction;

the second base color sub-pixel 11, the third base color sub-pixel 12 and the first base color sub-pixel 10 sequentially arranged in the third row are connected to the first data line S1, the second data line S2 and the third data line S3 respectively; and the third base color sub-pixel 12, the first base color sub-pixel 10 and the second base color sub-pixel 11 sequentially arranged in the fourth row are connected to the fourth data line S0, the first data line S1 and the second data line S2 respectively.

Figure 4:
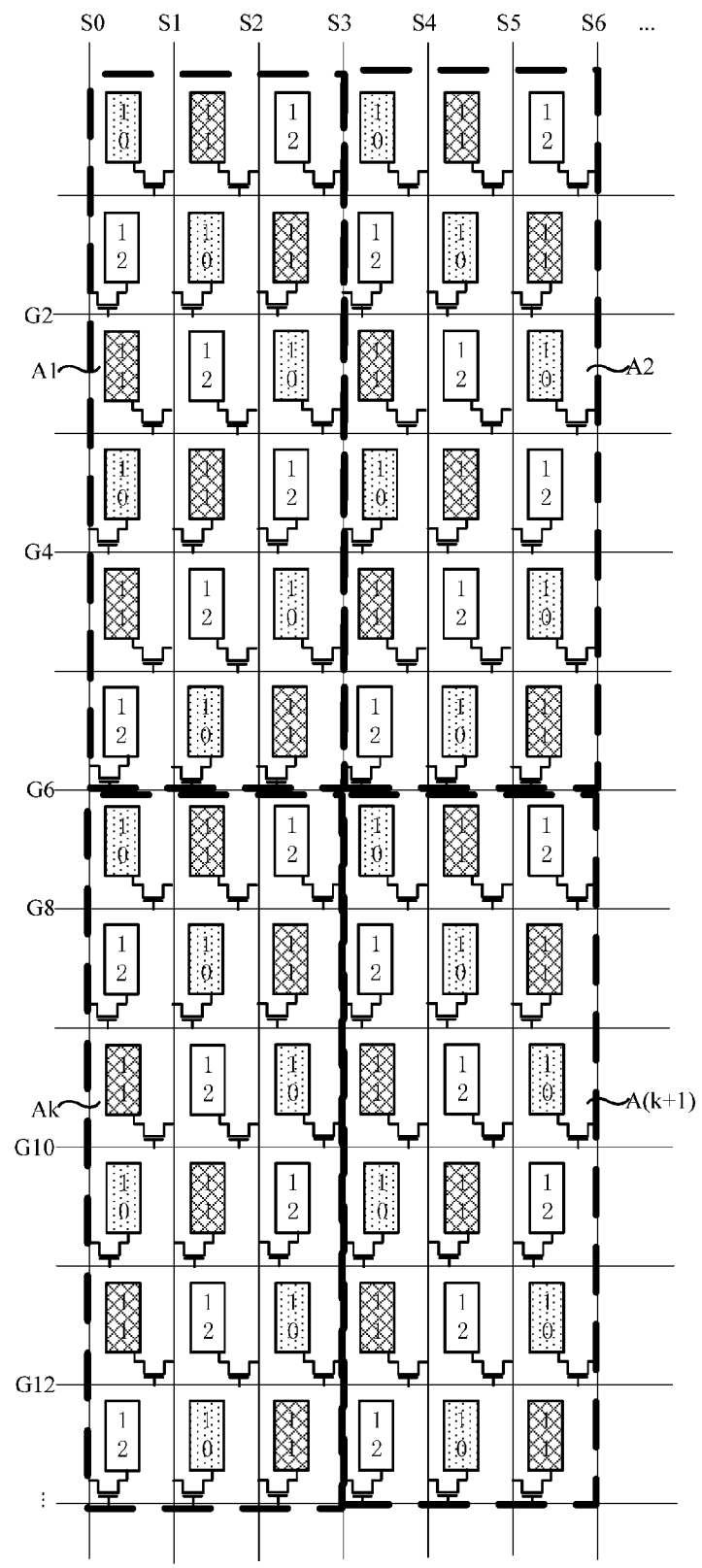
FIG. 4 is another schematic view showing an array substrate according to an embodiment of the present disclosure.

As a matter of fact, n may be any other integer that is equal to or greater than 1. For example, as illustrated in FIG. 4, n=3, and the first base color sub-pixel in the first row and the first base color sub-pixel in the second row are connected to a same data line in each sub-pixel dot matrix unit, then in the sub-pixel dot matrix unit A1:

the first base color sub-pixel 10, the second base color sub-pixel 11 and the third base color sub-pixel 12 sequentially arranged in the first row are connected to the first data line S1, the second data line S2 and the third data line S3 respectively;

the third base color sub-pixel 12, the first base color sub-pixel 10 and the second base color sub-pixel 11 sequentially arranged in the second row are connected to the fourth data line S0, the first data line S1 and the second data line S2 respectively, wherein the fourth data line S0 is neighboring with the first data line S1 in a direction opposite to the first direction;

the second base color sub-pixel 11, the third base color sub-pixel 12 and the first base color sub-pixel 10 sequentially arranged in the third row are connected to the first data line S1, the second data line S2 and the third data line S3 respectively;

the first base color sub-pixel 10, the second base color sub-pixel 11 and the third base color sub-pixel 12 sequentially arranged in the fourth row are connected to the fourth data line S0, the first data line S1 and the second data line S2 respectively;

the second base color sub-pixel 11, the third base color sub-pixel 12 and the first base color sub-pixel 10 sequentially arranged in the fifth row are connected to the first data line S1, the second data line S2 and the third data line S3 respectively; and the third base color sub-pixel 12, the first base color sub-pixel 10 and the second base color sub-pixel 11 sequentially arranged in the sixth row are connected to the fourth data line S0, the first data line S1 and the second data line S2 respectively.

Figure 5:
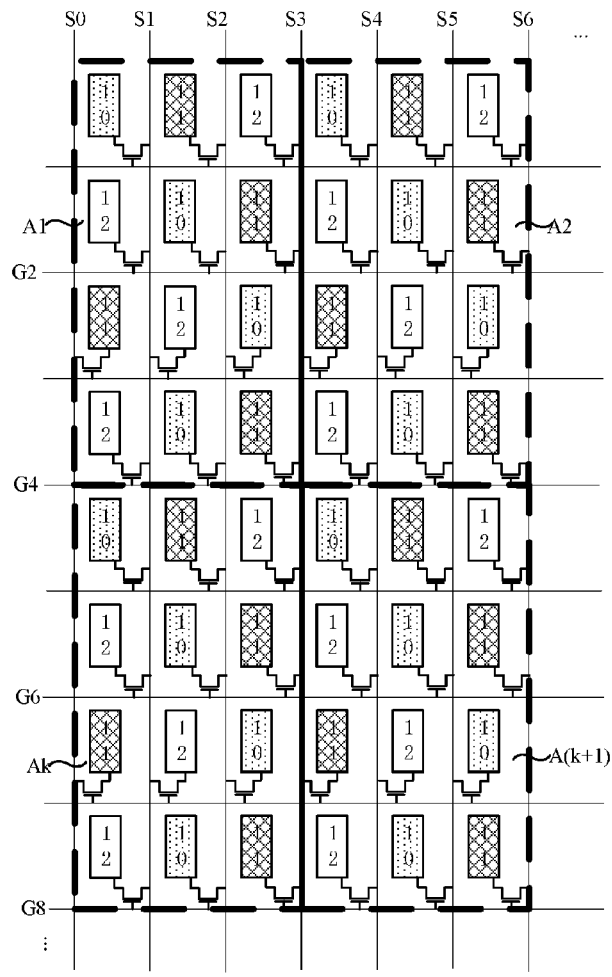
FIG. 5 is yet another schematic view showing an array substrate according to an embodiment of the present disclosure.

Furthermore, in each of the plurality of sub-pixel dot matrix units, it is possible that two first base color sub-pixels in the first row and the second row are not connected to the same data line. For example, as illustrated in FIG. 5, there are a plurality of sub-pixel dot matrix units (A1, A2, ..., Ak, A(k+1) ... ), n=2, and the first base color sub-pixel in the second row and the first base color sub-pixel in the third row are connected to a same data line in each of the sub-pixel dot matrix units. in this case, in the sub-pixel dot matrix unit A:

the first base color sub-pixel 10, the second base color sub-pixel 11 and the third base color sub-pixel 12 sequentially arranged in the first row are connected to the first data line S1, the second data line S2 and the third data line S3 respectively;

the third base color sub-pixel 12, the first base color sub-pixel 10 and the second base color sub-pixel 11 sequentially arranged in the second row are connected to the first data line S1, the second data line S2 and the third data line S3 respectively;

the second base color sub-pixel 11, the third base color sub-pixel 12 and the first base color sub-pixel 10 sequentially arranged in the third row are connected to the fourth data line S0, the first data line S1 and the second data line S2 respectively, wherein the fourth data line S0 is neighboring with the first data line S1 in a direction opposite to the first direction; and the third base color sub-pixel 12, the first base color sub-pixel 10 and the second base color sub-pixel 11 sequentially arranged in the fourth row are connected to the first data line S1, the second data line S2 and the third data line S3 respectively.

It is noted that, in the embodiments of the present disclosure, the fourth data line may be regarded as the third data line in a prior sub-pixel dot matrix unit, and the present disclosure is not limited thereto.

In the embodiment of the present disclosure, the sub-pixels in the i-th row in the array substrate are arranged in a sequence obtained by moving the sub-pixels in an (i−1)-th row by one position along a first direction or a second direction opposite to the first direction. The sub-pixels in an (n+1+j)-th row are arranged in a same sequence as the sub-pixels in an (n+1−j)-th row, In each of the plurality of sub-pixel dot matrix units, the sub-pixels in a same row are connected to data lines arranged on a same side of the sub-pixels respectively, the sub-pixels in the rows where the sub-pixels are arranged in a same sequence are connected to the data lines in a same direction. Two first base color sub-pixels in at least two adjacent rows are connected to a same data line. In other words, at least two columns of the first base color sub-pixel/the second base color sub-pixel/the third base color sub-pixel may be connected to the same data line. As a result, it is not necessary for at least one of the data lines to be turned on when the image of solid color is to be displayed, and thereby the power consumption is reduced. For example, as illustrated in FIG. 2, when the image of the first base color is to be displayed, only the data lines S1 and S3 are required to be turned on. When the image of the second base color is to be displayed, only the data lines S1 and S2 are required to be turned on. When the image of the third base color is to be displayed, only the data lines S2 and S3 are required to be turned on. Thus, it is not necessary for one third of the data lines to be turned on when the image of solid color is to be displayed, so that the power consumption is reduced.

Embodiment 2

In this embodiment, it is provided a display panel including the array substrate according to the Embodiment 1, and thereby the configurations and the beneficial effects in Embodiment 2 are similar to those in Embodiment 1. Such configurations and beneficial effects have been discussed in details in the above embodiment, and thus are not repeatedly explained herein for clarity.

When the display panel is to be applied in the LCD device, the display panel may include a color filter substrate and the array substrate that are oppositely arranged to form a cell. The display panel may alternatively include the above array substrate and a packaging substrate, and in this case, the color filter layer is arranged on the array substrate (also called a color filter on array (COA) substrate) instead of being arranged on the packaging substrate.

When the display panel is to be applied in the OLED display device, the display panel may include the above array substrate and the above packaging substrate, wherein components such as a power line are typically arranged on the array substrate.

Embodiment 3

In the embodiment of the present disclosure, it is further provided a display device including the display panel according to the Embodiment 2. The configurations and the beneficial effects in Embodiment 3 are similar to those in the above Embodiment 2. Such configurations and beneficial effects have been discussed in details in the above embodiment, and thus are not repeatedly explained herein for clarity.

In the embodiment of the present disclosure, the display device may be a LCD device, such as a LCD monitor, a LCD television, a digital frame, a mobile phone, a tablet computer, or any other product or part that has a display function.

Embodiment 4

Figure 6:
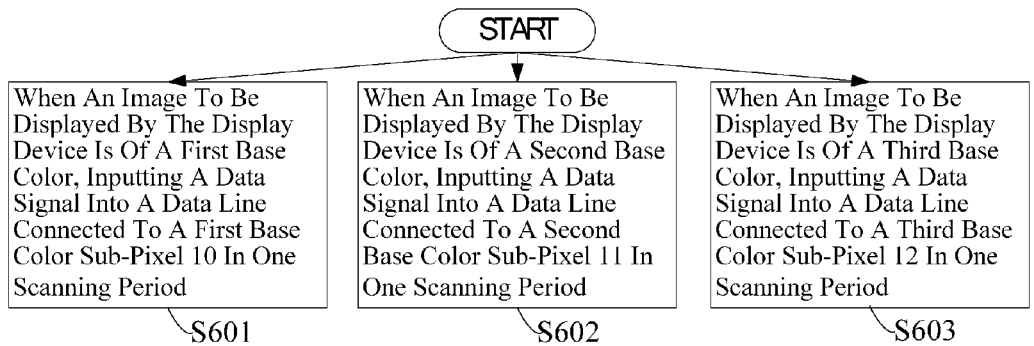
FIG. 6 is a flow chart showing a method for driving a display device according to an embodiment of the present disclosure.

In this embodiment of the present disclosure, it is provided a method for driving the display device in the Embodiment 3. As illustrated in FIG. 6, the method includes a step of:

S601: when an image to be displayed by the display device is of a first base color, inputting a data signal into a data line connected to a first base color sub-pixel 10 in one scanning period;

S602: when an image to be displayed by the display device is of a second base color, inputting a data signal into a data line connected to a second base color sub-pixel 11 in one scanning period; or S603: when an image to be displayed by the display device is of a third base color, inputting a data signal into a data line connected to a third base color sub-pixel 12 in one scanning period.

It should be noted that, the steps S601, S602 and S603 are not necessary to be executed sequentially, and they can be selected and executed in a needed manner. In other words, when the image to be displayed by the display device is of the first base color, the step S601 is executed; when the image to be displayed by the display device is of the second base color, the step S602 is executed; and when the image to be displayed by the display device is of the third base color, the step S603 is executed.

In the following embodiments, the methods for driving the display devices where n=2 and n=3 are explained in details respectively.

As illustrated in FIG. 2, when n=2, in the sub-pixel dot matrix unit A:

the first base color sub-pixel 10, the second base color sub-pixel 11 and the third base color sub-pixel 12 sequentially arranged in the first row are connected to the first data line S1, the second data line S2 and the third data line S3 respectively;

the third base color sub-pixel 12, the first base color sub-pixel 10 and the second base color sub-pixel 11 sequentially arranged in the second row are connected to the fourth data line S0, the first data line S1 and the second data line S2 respectively, wherein the fourth data line S0 is neighboring with the first data line S1 in a direction opposite to the first direction;

the second base color sub-pixel 11, the third base color sub-pixel 12 and the first base color sub-pixel 10 sequentially arranged in the third row are connected to the first data line S1, the second data line S2 and the third data line S3 respectively; and the third base color sub-pixel 12, the first base color sub-pixel 10 and the second base color sub-pixel 11 sequentially arranged in the fourth row are connected to the fourth data line S0, the first data line S1 and the second data line S2 respectively.

Figure 7:
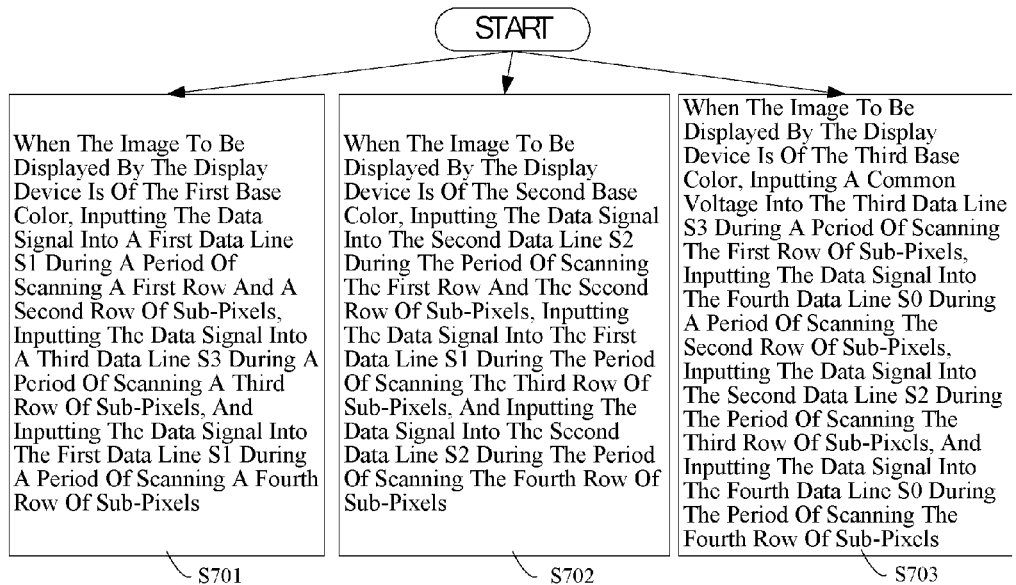
FIG. 7 is a flow charting showing a method for driving a display device including the array substrate as illustrated in FIG. 2 according to an embodiment of the present disclosure.

As illustrated in FIG. 7, the corresponding method includes a step of:

S701: when the image to be displayed by the display device is of the first base color, inputting the data signal into a first data line S1 during a period of scanning a first row and a second row of sub-pixels, inputting the data signal into a third data line S3 during a period of scanning a third row of sub-pixels, and inputting the data signal into the first data line S1 during a period of scanning a fourth row of sub-pixels;

S702: when the image to be displayed by the display device is of the second base color, inputting the data signal into the second data line S2 during the period of scanning the first row and the second row of sub-pixels, inputting the data signal into the first data line S1 during the period of scanning the third row of sub-pixels, and inputting the data signal into the second data line S2 during the period of scanning the fourth row of sub-pixels; or S703: when the image to be displayed by the display device is of the third base color, inputting the data signal into the third data line S3 during a period of scanning the first row of sub-pixels, inputting the data signal into the fourth data line S0 during a period of scanning the second row of sub-pixels, inputting the data signal into the second data line S2 during the period of scanning the third row of sub-pixels, and inputting the data signal into the fourth data line S0 during the period of scanning the fourth row of sub-pixels.

It should be noted that, the steps S701, S702 and S703 are not necessary to be executed sequentially, and they can be selected and executed in a needed manner. In other words, when the image to be displayed by the display device is of the first base color, the step S701 is executed; when the image to be displayed by the display device is of the second base color, the step S702 is executed; and when the image to be displayed by the display device is of the third base color, the step S703 is executed.

As illustrated in FIG. 4, when n=4, in the sub-pixel dot matrix unit A:

the first base color sub-pixel 10, the second base color sub-pixel 11 and the third base color sub-pixel 12 sequentially arranged in the first row are connected to the first data line S1, the second data line S2 and the third data line S3 respectively;

the third base color sub-pixel 12, the first base color sub-pixel 10 and the second base color sub-pixel 11 sequentially arranged in the second row are connected to the fourth data line S0, the first data line S1 and the second data line S2 respectively, wherein the fourth data line S0 is neighboring with the first data line S1 in a direction opposite to the first direction;

the second base color sub-pixel 11, the third base color sub-pixel 12 and the first base color sub-pixel 10 sequentially arranged in the third row are connected to the first data line S1, the second data line S2 and the third data line S3 respectively;

the first base color sub-pixel 10, the second base color sub-pixel 11 and the third base color sub-pixel 12 sequentially arranged in the fourth row are connected to the first data line S1, the second data line S2 and the third data line S3 respectively;

the second base color sub-pixel 11, the third base color sub-pixel 12 and the first base color sub-pixel 10 sequentially arranged in the fifth row are connected to the first data line S1, the second data line S2 and the third data line S3 respectively; and the third base color sub-pixel 12, the first base color sub-pixel 10 and the second base color sub-pixel 11 sequentially arranged in the sixth row are connected to the fourth data line S0, the first data line S1 and the second data line S2 respectively.

Figure 8:
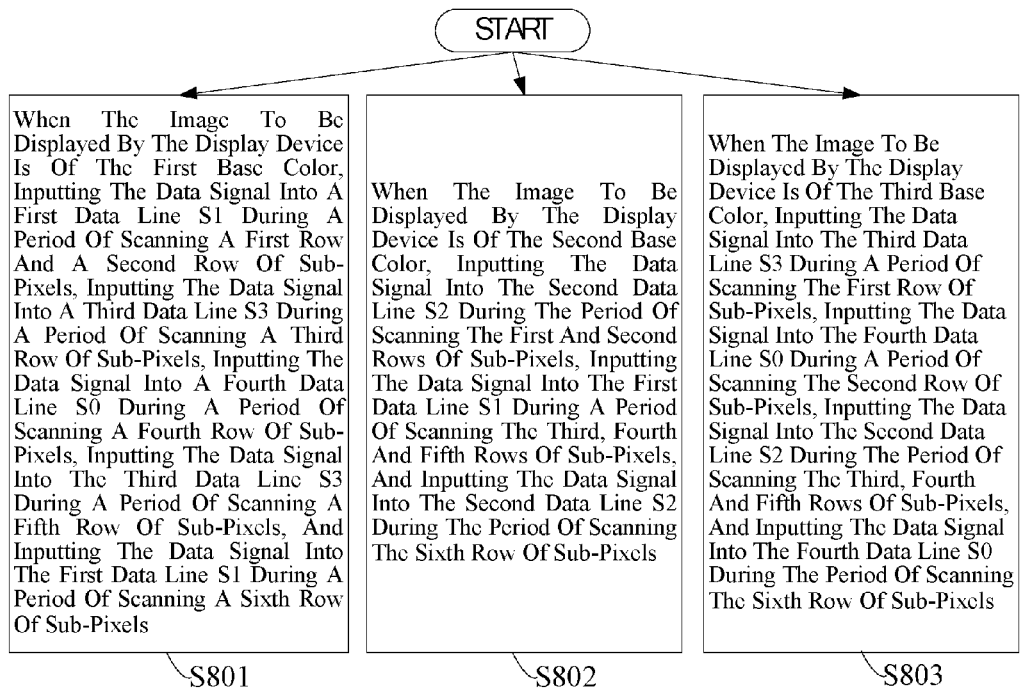
FIG. 8 is a flow charting showing a method for driving a display device including the array substrate as illustrated in FIG. 4 according to an embodiment of the present disclosure.

As illustrated in FIG. 8, the corresponding method includes steps of:

S801: when the image to be displayed by the display device is of the first base color, inputting the data signal into a first data line S1 during a period of scanning a first row and a second row of sub-pixels, inputting the data signal into a third data line S3 during a period of scanning a third row of sub-pixels, inputting the data signal into a fourth data line S0 during a period of scanning a fourth row of sub-pixels, inputting the data signal into the third data line S3 during a period of scanning a fifth row of sub-pixels, and inputting the data signal into the first data line S1 during a period of scanning a sixth row of sub-pixels;

S802: when the image to be displayed by the display device is of the second base color, inputting the data signal into the second data line S2 during the period of scanning the first and second rows of sub-pixels, inputting the data signal into the first data line S1 during a period of scanning the third, fourth and fifth rows of sub-pixels, and inputting the data signal into the second data line S2 during the period of scanning the sixth row of sub-pixels; or S803: when the image to be displayed by the display device is of the third base color, inputting the data signal into the third data line S3 during a period of scanning the first row of sub-pixels, inputting the data signal into the fourth data line S0 during a period of scanning the second row of sub-pixels, inputting the data signal into the second data line S2 during the period of scanning the third, fourth and fifth rows of sub-pixels, and inputting the data signal into the fourth data line S0 during the period of scanning the sixth row of sub-pixels.

It should be noted that, the steps S801, S802 and S803 are not necessary to be executed sequentially, and they can be selected and executed in a needed manner. In other words, when the image to be displayed by the display device is of the first base color, the step S801 is executed; when the image to be displayed by the display device is of the second base color, the step S802 is executed; and when the image to be displayed by the display device is of the third base color, the step S803 is executed.

It is noted that, as mentioned above, in the embodiment of the present disclosure, the first base color sub-pixel 10, the second base color sub-pixel 11 and the third base color sub-pixel 12 are one of the red sub-pixel, the green sub-pixel and the blue sub-pixel. For example, the first base color sub-pixel 10 may be the red sub-pixel, the second base color sub-pixel 11 may be the green sub-pixel, and the third base color sub-pixel 12 may be the blue sub-pixel; or the first base color sub-pixel 10 may be the green sub-pixel, the second base color sub-pixel 11 may be the red sub-pixel, and the third base color sub-pixel 12 may be the blue sub-pixel; or etc. The present disclosure is not limited to these examples.

Furthermore, in addition to the first base color sub-pixel 10, the second base color sub-pixel 11 and the third base color sub-pixel 12, each row of the sub-pixels in each sub-pixel dot matrix unit may further includes a fourth base color sub-pixel, a fifth base color sub-pixel, and etc., wherein the fourth base color sub-pixel and the fifth base color sub-pixel may be, for example a white (W) sub-pixel and a yellow (Y) sub-pixel respectively. The present disclosure is not limited thereto.

According to the driving method of the present disclosure, when an image to be displayed by the display device is of a first base color, a data signal is inputted into a data line connected to a first base color sub-pixel in one scanning period; or when the image to be displayed by the display device is of a second base color, the data signal is inputted into a data line connected to a second base color sub-pixel in the one scanning period; or when the image to be displayed by the display device is of a third base color, the data signal is inputted into a data line connected to a third base color sub-pixel in the one scanning period. In the array substrate included in the display device, two first base color sub-pixels in at least two adjacent rows are connected to a same data line. In other words, the first base color sub-pixels/the second base color sub-pixels/the third base color sub-pixels in at least two columns are connected to the same data line. As a result, it is not necessary for at least one of the data lines to be turned on when the image of solid color is to be displayed, and thereby the power consumption is reduced.

A person skilled in the art may understand that, all or some of the steps of the above method may be implemented by a hardware instructed by a program which may be stored in a computer readable storage medium. When the program is executed, the steps included in the method are executed. The storage medium may include any medium that is capable of storing program codes, such as a read only memory (ROM), random access memory (RAM), a magnetic disk or an optical disk.

The above are merely embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. Thus, a scope of the present disclosure is confined in claims.

What is claimed is:

1. An array substrate comprising a plurality of sub-pixel dot matrix units, wherein
    each of the plurality of sub-pixel dot matrix units is comprised of 2n rows of sub-pixels, and each row of the sub-pixels comprises a first base color sub-pixel, a second base color sub-pixel and a third base color sub-pixel, where n≥2 and n is a positive integer;
    in a first row, the first base color sub-pixel, the second base color sub-pixel and the third base color sub-pixel are arranged sequentially, the sub-pixels in an i-th row are arranged in a sequence obtained by moving the sub-pixels in an (i−1)-th row by one position along a first direction or a second direction opposite to the first direction, and the sub-pixels in an (n+1+j)-th row are arranged in a same sequence as the sub-pixels in an (n+1−j)-th row, where 2≤i≤n+1, 1≤j≤n−1, and both i and j are positive integers; and
    in each of the plurality of sub-pixel dot matrix units, the sub-pixels in a same row are connected to data lines arranged on a same side of the sub-pixels respectively, the sub-pixels in the rows where the sub-pixels are arranged in a same sequence are connected to the data lines in a same direction, and two first base color sub-pixels in at least two adjacent rows are connected to a same data line.

2. The array substrate according to claim 1, wherein in each of the plurality of sub-pixel dot matrix units, two first base color sub-pixels in the first row and a second row are connected to a same data line.

3. The array substrate according to claim 2, wherein when n=2, in each of the plurality of sub-pixel dot matrix units,
    the first base color sub-pixel, the second base color sub-pixel and the third base color sub-pixel in the first row are connected to a first data line, a second data line and a third data line respectively;
    the third base color sub-pixel, the first base color sub-pixel and the second base color sub-pixel in the second row are connected to a fourth data line, the first data line and the second data line respectively, wherein the fourth data line is neighboring with the first data line in the second direction;
    the second base color sub-pixel, the third base color sub-pixel and the first base color sub-pixel in a third row are connected to the first data line, the second data line and the third data line respectively; and
    the third base color sub-pixel, the first base color sub-pixel and the second base color sub-pixel in a fourth row are connected to the fourth data line, the first data line and the second data line respectively.

4. The array substrate according to claim 3, wherein the first base color sub-pixel, the second base color sub-pixel and the third base color sub-pixel are a red sub-pixel, a green sub-pixel and a blue sub-pixel respectively.

5. The array substrate according to claim 2, wherein when n=3, in each of the plurality of sub-pixel dot matrix units,
    the first base color sub-pixel, the second base color sub-pixel and the third base color sub-pixel in the first row are connected to a first data line, a second data line and a third data line respectively;
    the third base color sub-pixel, the first base color sub-pixel and the second base color sub-pixel in the second row are connected to a fourth data line, the first data line and the second data line respectively, wherein the fourth data line is neighboring with the first data line in the second direction;
    the second base color sub-pixel, the third base color sub-pixel and the first base color sub-pixel in a third row are connected to the first data line, the second data line and the third data line respectively;
    the first base color sub-pixel, the second base color sub-pixel and the third base color sub-pixel in a fourth row are connected to the fourth data line, the first data line and the second data line respectively;
    the second base color sub-pixel, the third base color sub-pixel and the first base color sub-pixel in a fifth row are connected to the first data line, the second data line and the third data line respectively; and
    the third base color sub-pixel, the first base color sub-pixel and the second base color sub-pixel in a sixth row are connected to the fourth data line, the first data line and the second data line respectively.

6. The array substrate according to claim 5, wherein the first base color sub-pixel, the second base color sub-pixel and the third base color sub-pixel are a red sub-pixel, a green sub-pixel and a blue sub-pixel respectively.

7. The array substrate according to claim 2, wherein the first base color sub-pixel, the second base color sub-pixel and the third base color sub-pixel are a red sub-pixel, a green sub-pixel and a blue sub-pixel respectively.

8. The array substrate according to claim 1, wherein the first base color sub-pixel, the second base color sub-pixel and the third base color sub-pixel are a red sub-pixel, a green sub-pixel and a blue sub-pixel respectively.

9. A display panel comprising the array substrate according to claim 1.

10. A display device comprising the display panel according to claim 9.

11. A method for driving the display device according to claim 10, comprising a step of:
when an image to be displayed by the display device is of a first base color, inputting a data signal into a data line connected to a first base color sub-pixel in one scanning period; or
when the image to be displayed by the display device is of a second base color, inputting the data signal into a data line connected to a second base color sub-pixel in the one scanning period; or
when the image to be displayed by the display device is of a third base color, inputting the data signal into a data line connected to a third base color sub-pixel in the one scanning period.

12. The method according to claim 11, wherein n=2, and for each of the plurality of sub-pixel dot matrix units, the method comprises:
when the image to be displayed by the display device is of the first base color, inputting the data signal into a first data line during a period of scanning a first row and a second row of sub-pixels, inputting the data signal into a third data line during a period of scanning a third row of sub-pixels, and inputting the data signal into the first data line during a period of scanning a fourth row of sub-pixels;
when the image to be displayed by the display device is of the second base color, inputting the data signal into the second data line during the period of scanning the first row and the second row of sub-pixels, inputting the data signal into the first data line during the period of scanning the third row of sub-pixels, and inputting the data signal into the second data line during the period of scanning the fourth row of sub-pixels; and
when the image to be displayed by the display device is of the third base color, inputting the data signal into the third data line during a period of scanning the first row of sub-pixels, inputting the data signal into the fourth data line during a period of scanning the second row of sub-pixels, inputting the data signal into the second data line during the period of scanning the third row of sub-pixels, and inputting the data signal into the fourth data line during the period of scanning the fourth row of sub-pixels,
wherein, in each of the plurality of sub-pixel dot matrix units, the first data line, the second data line and the third data line are arranged sequentially in a first direction, and the fourth data line is neighboring with the first data line in a second direction opposite to the first direction.

13. The method according to claim 12, wherein the first base color sub-pixel, the second base color sub-pixel and the third base color sub-pixel are a red sub-pixel, a green sub-pixel and a blue sub-pixel respectively.

14. The method according to claim 11, wherein n=3, and for each of the plurality of sub-pixel dot matrix units, the method comprises:
when the image to be displayed by the display device is of the first base color, inputting the data signal into a first data line during a period of scanning a first row and a second row of sub-pixels, inputting the data signal into a third data line during a period of scanning a third row of sub-pixels, inputting the data signal into a fourth data line during a period of scanning a fourth row of sub-pixels, inputting the data signal into the third data line during a period of scanning a fifth row of sub-pixels, and inputting the data signal into the first data line during a period of scanning a sixth row of sub-pixels;
when the image to be displayed by the display device is of the second base color, inputting the data signal into the second data line during the period of scanning the first and second rows of sub-pixels, inputting the data signal into the first data line during a period of scanning the third, fourth and fifth rows of sub-pixels, and inputting the data signal into the second data line during the period of scanning the sixth row of sub-pixels; and
when the image to be displayed by the display device is of the third base color, inputting the data signal into the third data line during a period of scanning the first row of sub-pixels, inputting the data signal into the fourth data line during a period of scanning the second row of sub-pixels, inputting the data signal into the second data line during the period of scanning the third, fourth and fifth rows of sub-pixels, and inputting the data signal into the fourth data line during the period of scanning the sixth row of sub-pixels,
wherein, in each of the plurality of sub-pixel dot matrix units, the first data line, the second data line and the third data line are arranged sequentially in a first direction, and the fourth data line is neighboring with the first data line in a second direction opposite to the first direction.

15. The method according to claim 14, wherein the first base color sub-pixel, the second base color sub-pixel and the third base color sub-pixel are a red sub-pixel, a green sub-pixel and a blue sub-pixel respectively.

16. The method according to claim 11, wherein the first base color sub-pixel, the second base color sub-pixel and the third base color sub-pixel are a red sub-pixel, a green sub-pixel and a blue sub-pixel respectively.

17. The display panel according to claim 9, wherein in each of the plurality of sub-pixel dot matrix units, two first base color sub-pixels in the first row and a second row are connected to a same data line.

18. The display panel according to claim 17, wherein when n=2, in each of the plurality of sub-pixel dot matrix units,
the first base color sub-pixel, the second base color sub-pixel and the third base color sub-pixel in the first row are connected to a first data line, a second data line and a third data line respectively;
the third base color sub-pixel, the first base color sub-pixel and the second base color sub-pixel in the second row are connected to a fourth data line, the first data line and the second data line respectively, wherein the fourth data line is neighboring with the first data line in the second direction;

the second base color sub-pixel, the third base color sub-pixel and the first base color sub-pixel in a third row are connected to the first data line, the second data line and the third data line respectively; and the third base color sub-pixel, the first base color sub-pixel and the second base color sub-pixel in a fourth row are connected to the fourth data line, the first data line and the second data line respectively.

19. The display panel according to claim 17, wherein when n=3, in each of the plurality of sub-pixel dot matrix units, the first base color sub-pixel, the second base color sub-pixel and the third base color sub-pixel in the first row are connected to a first data line, a second data line and a third data line respectively;

the third base color sub-pixel, the first base color sub-pixel and the second base color sub-pixel in the second row are connected to a fourth data line, the first data line and the second data line respectively, wherein the fourth data line is neighboring with the first data line in the second direction;

the second base color sub-pixel, the third base color sub-pixel and the first base color sub-pixel in a third row are connected to the first data line, the second data line and the third data line respectively;

the first base color sub-pixel, the second base color sub-pixel and the third base color sub-pixel in a fourth row are connected to the fourth data line, the first data line and the second data line respectively;

the second base color sub-pixel, the third base color sub-pixel and the first base color sub-pixel in a fifth row are connected to the first data line, the second data line and the third data line respectively; and the third base color sub-pixel, the first base color sub-pixel and the second base color sub-pixel in a sixth row are connected to the fourth data line, the first data line and the second data line respectively.

20. The display panel according to claim 9, wherein the first base color sub-pixel, the second base color sub-pixel and the third base color sub-pixel are a red sub-pixel, a green sub-pixel and a blue sub-pixel respectively.

* * * * *